United States Patent
Kaynak et al.

(10) Patent No.: US 12,412,632 B2
(45) Date of Patent: *Sep. 9, 2025

(54) MANAGING COMPENSATION FOR CHARGE COUPLING AND LATERAL MIGRATION IN MEMORY DEVICES

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/744,146

(22) Filed: Jun. 14, 2024

(65) Prior Publication Data

US 2024/0331778 A1 Oct. 3, 2024

Related U.S. Application Data

(63) Continuation of application No. 17/860,690, filed on Jul. 8, 2022, now Pat. No. 12,046,298.

(60) Provisional application No. 63/348,293, filed on Jun. 2, 2022.

(51) Int. Cl.
| | |
|---|---|
| *G11C 16/26* | (2006.01) |
| *G06F 3/06* | (2006.01) |
| *G11C 16/34* | (2006.01) |
| *G11C 16/04* | (2006.01) |

(52) U.S. Cl.
CPC ............ *G11C 16/26* (2013.01); *G06F 3/0604* (2013.01); *G06F 3/0655* (2013.01); *G06F 3/0679* (2013.01); *G11C 16/3459* (2013.01); *G11C 16/0483* (2013.01)

(58) Field of Classification Search
CPC . G11C 16/26; G11C 16/3459; G11C 16/0483; G11C 16/3431; G06F 3/0604; G06F 3/0655; G06F 3/0679
USPC ...................................... 365/185.22
See application file for complete search history.

(56) References Cited

U.S. PATENT DOCUMENTS

| | | | |
|---|---|---|---|
| 12,046,298 B2 * | 7/2024 | Kaynak | ................. G06F 3/0604 |
| 2008/0056007 A1 | 3/2008 | Kang et al. | |
| 2009/0285024 A1 | 11/2009 | Kang | |
| 2015/0149693 A1 | 5/2015 | Ng et al. | |

* cited by examiner

*Primary Examiner* — Amir Zarabian
*Assistant Examiner* — Minh Dinh
(74) *Attorney, Agent, or Firm* — Lowenstein Sandler LLP

(57) ABSTRACT

Embodiments disclosed can include selecting a target read window budget (RWB) increase and identifying a set of aggressor memory cells. They can also include generating a list of programming level states for the set of aggressor memory cells and identifying, in the list, an entry associated with a maximum RWB increase that is greater than or equal to the target RWB increase. They can further include responsive to identifying the entry with the total number of bits associated with a maximum RWB increase that is greater than or equal to the target RWB increase, modifying a parameter of the memory access operation with the adjustment associated with the identified entry.

20 Claims, 7 Drawing Sheets

300

SELECTING A TARGET READ WINDOW BUDGET (RWB) INCREASE FOR A SPECIFIED MEMORY CELL 302

IDENTIFYING A SET OF AGGRESSOR MEMORY CELLS THAT ARE ADJACENT TO THE SPECIFIED MEMORY CELL 304

GENERATING A LIST OF PROGRAMMING LEVEL STATES FOR THE SET OF AGGRESSOR MEMORY CELLS, WHERE EACH ENTRY IN THE LIST SPECIFIES, FOR EACH AGGRESSOR MEMORY CELL IN THE SET, A RESPECTIVE NUMBER OF BITS USED TO REFLECT THE PROGRAMMING LEVEL OF THE AGGRESSOR MEMORY CELL IN THE SET, AND WHEREIN A TOTAL NUMBER OF BITS SPECIFIED BY EACH ENTRY IS ASSOCIATED WITH A CORRESPONDING MAXIMUM RWB INCREASE RESULTING FROM AN ADJUSTMENT TO A PARAMETER OF A MEMORY ACCESS OPERATION THAT IS PERFORMED WITH RESPECT TO THE SPECIFIED MEMORY CELL, THE ADJUSTMENT BASED ON A MAXIMUM NUMBER OF PROGRAMMING LEVELS SPECIFIED BY THE BITS IN THE ENTRY 306

IDENTIFYING, IN THE LIST, AN ENTRY ASSOCIATED WITH A MAXIMUM RWB INCREASE THAT IS GREATER THAN OR EQUAL TO THE TARGET RWB INCREASE, THE ENTRY COMPRISING A LOWEST NUMBER OF BITS 308

MODIFYING THE PARAMETER OF THE MEMORY ACCESS OPERATION WITH THE ADJUSTMENT ASSOCIATED WITH THE IDENTIFIED ENTRY 310

FIG. 3 ial electric charge or voltage (e.g., threshold voltage V_T) that defines a memory state of the cell (i.e., the logical value that the cell will retain). The range of possible threshold voltages V_T of a memory cell can be divided into multiple voltage bins (also referred to as "threshold voltage distributions," "voltage distributions," or simply "distributions" herein), with each voltage bin corresponding to a respective memory state. The number of bins can depend on the bit-capacity of a cell. For example, a single-level cell (SLC) can have two logic states (e.g., "1" and "0") corresponding to two respective voltage bins. Multi-level cells (MLCs) can store two bits per cell and can have four logic states (e.g., "11", "10", "01", and "00") corresponding to four respective voltage bins. Triple-level cells (TLCs) can store three bits per cell and can have eight logic states (e.g., "111", "110", "101", "100", "011", "010", "001", and "000") corresponding to eight respective voltage bins. Quad-level cells (QLC) can store four bits per cell and can have sixteen logic states.

MANAGING COMPENSATION FOR CHARGE COUPLING AND LATERAL MIGRATION IN MEMORY DEVICES

RELATED APPLICATIONS

This application is a continuation of U.S. patent application Ser. No. 17/860,690 filed on Jul. 8, 2022, which claims the benefit of U.S. Provisional Patent Application No. 63/348,293, filed Jun. 2, 2022. The above-referenced applications are incorporated herein by reference in their respective entireties.

TECHNICAL FIELD

Embodiments of the disclosure relate generally to memory sub-systems, and more specifically, relate to managing compensation for charge coupling and lateral migration in memory devices.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIG. 3 is a flow diagram of an example method for compensation management in accordance with some embodiments of the present disclosure;

DETAILED DESCRIPTION

Figure 1:
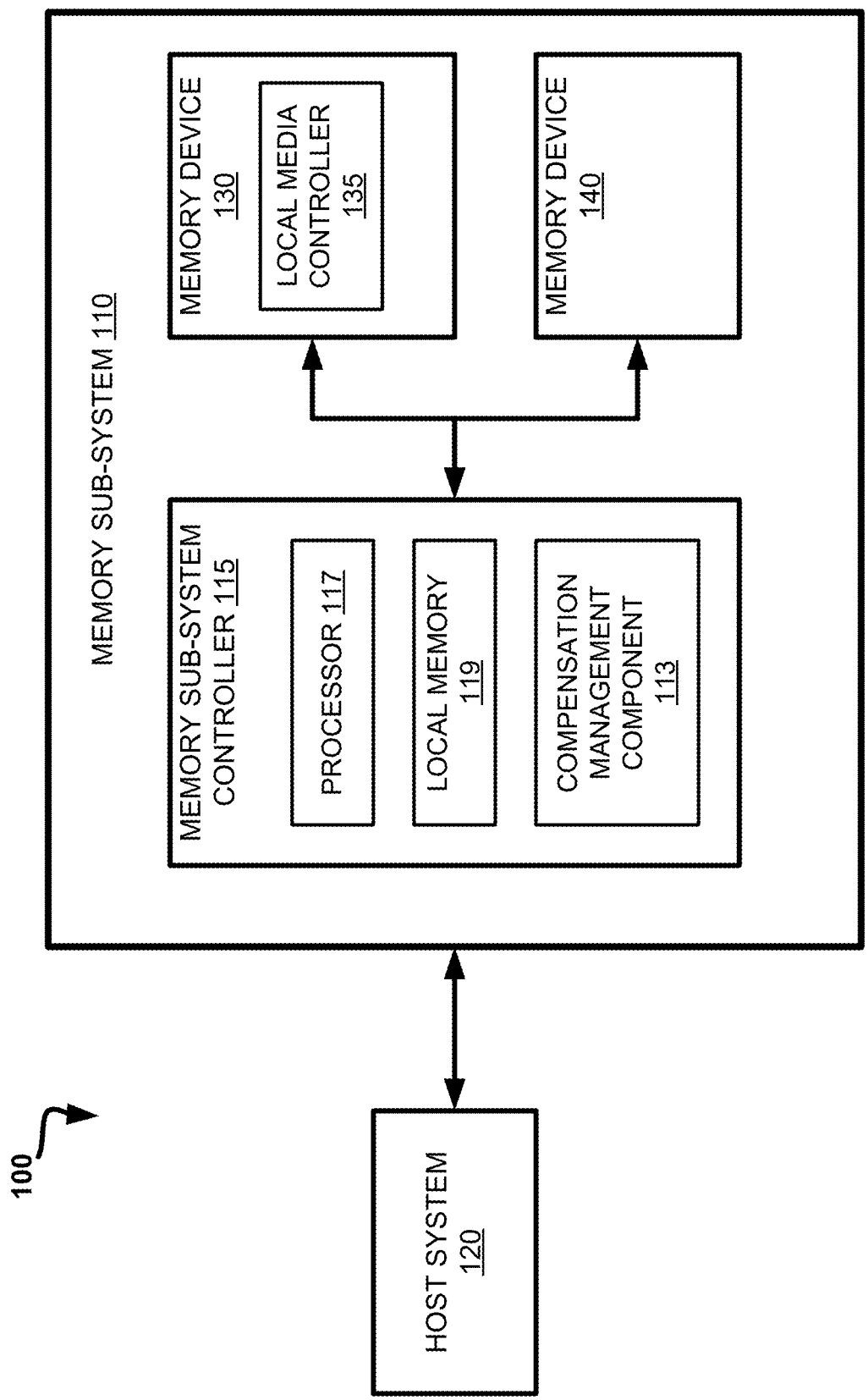
FIG. 1 illustrates an example computing system that includes a memory sub-system in accordance with some embodiments of the present disclosure.

Aspects of the present disclosure are directed to managing compensation for charge coupling and lateral migration in memory devices. A memory sub-system can be a storage device, a memory module, or a combination of a storage device and memory module. Examples of storage devices and memory modules are described below in conjunction with FIGS. 1-2A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1-2A. A non-volatile memory device is a package of one or more dies. Each die can consist of one or more planes. For some types of non-volatile memory devices (e.g., NAND devices), each plane includes a set of physical blocks. Each block includes a set of pages. Each page includes a set of memory cells ("cells"). A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device includes multiple memory cells arranged in a two-dimensional or three-dimensional grid. Memory cells are formed on (e.g., etched onto) a silicon wafer in an array of columns connected by conductive lines (also hereinafter referred to as bitlines) and rows connected by conductive lines (also hereinafter referred to as wordlines). A wordline can refer to a conductive line that connects control gates of a set (e.g., one or more rows) of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. In another example, the memory device can include multiple access line driver circuits and power circuits that can be shared by the planes of the memory device. For case of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_t$ (also referred to as the "threshold voltage") such that the source-drain electric current is low for the control gate voltage ($V_{CG}$) being below the threshold voltage, $V_{CG}<V_t$. The current increases substantially once the control gate voltage has exceeded the threshold voltage, $V_{CG}>V_t$. Because the actual geometry of the electrodes and gates varies from cell to cell, the threshold voltages can be different even for cells implemented on the same die. The cells can, therefore, be characterized by a distribution P of the threshold voltages, $P(Q, V_t)=dW/dV_t$, where dW represents the probability that any given cell has its threshold voltage within the interval $[V_t, V_t+dV_t]$ when charge Q is placed on the cell.

A programming operation can include the application of a series of incrementally increasing programming pulses that to a control gate of a memory cell being programmed. A program verify operation after each programming pulse determines the threshold voltage of the memory cell resulting from the preceding programming pulse. When memory cells are programmed, the level of the programming achieved in a cell (e.g., the $V_t$ of the cell) is verified, in effect, by comparing the cell $V_t$ to a target (i.e., desired) program verify (PV) voltage level. The PV voltage level can be provided by an external reference.

A typical program verify operation includes referring to a target threshold voltage and applying a ramped voltage to the control gate of the memory cell being verified. When the ramped voltage reaches the threshold voltage to which the memory cell has been programmed, the memory cell turns on and sense circuitry detects a current on a bit line coupled to the memory cell. The detected current activates the sense circuitry to compare whether the present threshold voltage is greater than or equal to the stored target threshold voltage. If the present threshold voltage is greater than or equal to the target threshold voltage, further programming is inhibited. Otherwise, Programming typically continues in this manner with the application of additional program pulses to the memory cell until the target PV of a corresponding $V_t$ and data state is achieved.

Accordingly, certain non-volatile memory devices can use a demarcation voltage (i.e., a read reference voltage) to read data stored at memory cells. For example, a read reference voltage can be applied to the memory cells, and if a threshold voltage of a specified memory cell is identified as being below the read reference voltage that is applied to the specified memory cell, then the data stored at the specified memory cell can be read as a particular value (e.g., a logical '1') or determined to be in a particular state (e.g., a set state). If the threshold voltage of the specified memory cell is identified as being above the read reference voltage, then the data stored at the specified memory cell can be read as another value (e.g., a logical '0') or determined to be in another state (e.g., a reset state). Thus, the read reference voltage can be applied to memory cells to determine values stored at the memory cells. Such threshold voltages can be within a range of threshold voltages or comprise a normal distribution of threshold voltages.

A memory device can exhibit threshold voltage distributions $P(Q, V_t)$ that are narrow compared with the working range of control voltages tolerated by the cells of the device. Accordingly, multiple non-overlapping distributions $P(Q_k,$ $V_t)$ ("valleys") can be fit into the working range allowing for storage and reliable detection of multiple values of the charge $Q_k$, k=1, 2, 3 . . . . The distributions (valleys) are interspersed with voltage intervals ("valley margins") where none (or very few) of the cells of the device have their threshold voltages. Such valley margins can, therefore, be used to separate various charge states $Q_k$—the logical state of the cell can be determined by detecting, during a read operation, between which two valley margins the respective threshold voltage $V_t$ of the cell resides. This effectively allows a single memory cell to store multiple bits of information: a memory cell operated with 2N−1 well-defined valley margins and 2N valleys is capable of reliably storing N bits of information. Specifically, the read operation can be performed by comparing the measured threshold voltage $V_t$ exhibited by the memory cell to one or more reference voltage levels corresponding to known valley margins (e.g., centers of the margins) of the memory device in order to distinguish between the multiple logical programming levels and determine the programming state of the cell.

One type of cell is a single level cell (SLC), which stores 1 bit per cell and defines 2 logical states ("states") ("1" or "L0" and "0" or "L1") each corresponding to a respective $V_t$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_t$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_t$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. Thus, an n-level cell can use $2^n$ levels of charge to store n bits. A memory device can include one or more arrays of memory cells such as SLCs, MLCs, TLCs, QLCS, PLCs, etc. or any combination of such. For example, a memory device can include an SLC portion, and an MLC portion, a TLC portion, a QLC portion, or a PLC portion of cells.

A valley margin can also be referred to as a read window. For example, in a SLC cell, there is 1 read window that exists with respect to the 2 $V_t$ distributions. Analogously, in an MLC cell, there are 3 read windows that exist with respect to the 4 $V_t$ distributions. Similarly, in a TLC cell, there are 7 read windows that exist with respect to the 8 $V_t$ distributions. Read window size generally decreases as the number of states increases. For example, the 1 read window for the SLC cell may be larger than each of the 3 read windows for the MLC cell, and each of the 3 read windows for the MLC cell may be larger than each of the 7 read windows for the TLC cell, etc. Read window budget (RWB) refers to the cumulative value of the read windows.

Cells of a memory array that are to be read during a read operation can be referred to specified cells (i.e., target cells) connected to a target wordline. The specified cells can neighbor adjacent cells connected to at least one wordline neighboring the specified wordline ("adjacent wordline" i.e., the wordline to which the specified cell is connected). For example, the at least one adjacent wordline can be a single wordline neighboring the specified wordline or a pair of wordlines neighboring the target wordline. Illustratively, the specified wordline can be referred to as an n-th wordline ($WL_n$), and the at least one adjacent wordline can include at least one of adjacent wordline n−1 ($WL_{n-1}$) or adjacent wordline n+1 ($WL_{n+1}$). For example, in a 3D memory device, the set of adjacent wordlines can include a wordline located directly above the target wordline and/or a wordline located directly below the target wordline.

Accordingly, each specified cell can have a respective group of adjacent cells. Each group of adjacent cells can include at least one cell that neighbors its respective specified cell (e.g., one cell connected to $WL_{n-1}$ and/or one cell connected to $WL_{n+1}$). More specifically, each specified cell can be connected to the same bitline as each cell of the respective group of adjacent cells, such that the specified cell and the cells of the respective group of adjacent cells are within the same string. Accordingly, each group of adjacent cells can include a single adjacent cell, or a pair of adjacent cells connected to a same bitline as a respective specified cell.

Some memory devices are subject to physical phenomena that affect the charge stored in their cells and consequently, also affect the respective threshold voltages of the cells. These phenomena can arise in a memory array between one or more specified cells and their respective groups of adjacent cells. A couple of such phenomena are referred to herein as cell-to-cell coupling (i.e., capacitive coupling between cells that causes interference) and lateral migration (i.e., charge migration between adjacent cells). Cell-to-cell coupling between cells occurs due to capacitive coupling between charge storage structures (e.g., transistors) of adjacent memory cells. For example, the $V_t$ of a specified cell programmed to a target state (e.g., a particular programming level) can change due to capacitive coupling associated with transistors of adjacent cells. The amount of $V_t$ change (i.e., $V_t$ shift), of the specified cell due to cell-to-cell coupling can depend on the $V_t$ of one or more adjacent cells. For instance, adjacent cells programmed to a higher programming level (i.e., a state associated with a higher $V_t$) may have a greater effect on the $V_t$ of the specified cell than adjacent cells programmed to a lower programming level (i.e., a state associated with a lower $V_t$). In some instances, the $V_t$ shift of a specified cell caused by the programming of an adjacent cell, can lead to erroneous sensing (e.g., during a memory access operations) of the specified cell.

Lateral migration can have analogous effects. For example, after a cell adjacent to a specified cell is programmed, the electrons can diffuse laterally (i.e., along the wordline) from the charge storage structure of the adjacent cell toward the charge storage structures of the specified cell by tunneling through intervening layers between them. Moreover, this diffusion can depend on (i.e., may be a function of) the respective programming level of neighboring cells connected to the same bitline as the specified cell. Consequently, lateral migration of charge (i.e., as a function of time and of the programming levels of the adjacent cells on the bitline) from an adjacent cell on the wordline can also shift the $V_t$ of the specified cell due to the loss of charge (i.e., electrons) that was previously present.

Accordingly, both cell-to-cell coupling and lateral migration can lead to significant $V_t$ shifts which can depend on the programming level of adjacent cells along the bitline of a specified cell. For example, the shift can be sufficient to cause a memory access operations performed on the specified cell to result in a determined sensed state other than the one associated with the programming level of the specified cell. Consequently, for a given programming level, the cells in the memory device can be characterized by multiple $V_t$ sub-distributions with each sub-distribution being associated with (e.g., caused by) a particular programming level of an adjacent cell (e.g., via one of the aforementioned phenomena). The mean of each of these distributions will be shifted from the default $V_t$ for a given programming level by an amount correlated with the programming level of the corresponding group of adjacent cell(s). Thus, when these effects are considered for a multiple cells in one or more memory arrays on a memory device, these phenomena can result in a lowering and widening of the $V_t$ distribution for any programmed state and therefore impair the ability to accurately read the cells. The $V_t$ distribution widening can, in turn, cause RWB degradation and negatively affect memory device reliability. For example, RWB degradation can lead to an increase in the number of errors (e.g., bit errors) and/or error rate (e.g., bit error rate (BER)).

More specifically, cell-to-cell coupling and lateral migration can entail a change in $V_t$ of one transistor (e.g., of a memory cell) influencing the $V_t$ of one or more neighboring transistors (e.g., of a memory cell) to shift through a parasitic capacitance-coupling effect. These $V_t$ shifts disadvantageously results in an expansion of the corresponding $V_t$ distributions (i.e., of multiple cells in an array) in order to accommodate all possible threshold voltages for a given state and further results in a reduction of the RWB corresponding to the programming distributions associated with the various programming levels. Notably, the RWB can refer to the cumulative value (e.g., in voltage) of a number (e.g., seven) of distances (e.g., measured in voltage) between adjacent threshold voltage distributions at a particular BER. For the purposes of this disclosure, in the context of cell-to-cell coupling and lateral migration phenomena, a cell whose $V_t$ is affected by the programming level of a neighboring cell can be referred to herein as a "victim" cell. Analogously, in the same context, a cell whose programming level affects the $V_t$ of a neighboring cell can be referred to herein as an "aggressor" cell.

In some situations, the effects of cell-to-cell coupling and lateral migration can be mitigated by compensation during read operations or programming (i.e., write) operations that are performed on the cells of the memory device. More specifically, adjustments can be made to voltages applied to a cell in the course of read operations and write operations to compensate for the multiple shifted $V_t$ sub-distributions created due to the effects of corresponding programming levels of one or more adjacent aggressor cells. These adjusted voltages (e.g., a read reference voltage or a program-verify voltage) applied in the course of such memory access operations can be offset (e.g., in an opposite direction) relative to the $V_t$ of a specified cell to counteract the effects of cell-to-cell coupling and lateral migration. In general, each possible $V_t$ shift of a specified memory cell caused by one or more adjacent aggressor cell's programming level can be accounted by shifting the means (i.e., mathematical averages) of the resulting $V_t$ sub-distributions closer together or even by aligning them completely. This alignment can be achieved during programming of the cell by applying offset programming voltage pulses and PV voltages to the cell such that the resulting $V_t$ of the cell aligns with the desired target value due to effect of cell-to-cell coupling and lateral migration. Similarly, an alignment of sensed $V_t$ can be achieved when reading a cell by offsetting a read reference voltage such that the perceived sensed state's $V_t$ aligns with the desired target value after the effect of cell-to-cell coupling and lateral migration is considered. Accordingly, the respective means of the sub-distributions can be shifted and aligned by applying one or more adjusted voltages to the specified memory cell during a memory access operation. Shifting the means of the sub-distributions closer together compensates for the widening of the overarching distribution for a given specified cell programming level caused by cell-to-cell coupling and lateral migration effects of the aggressor memory cells.

Perfect compensation, for a particular programming level of a specified cell, can be achieved by aligning the means of all of the possible sub-distributions to account for all the possible corresponding $V_t$ shifts caused by cell-to-cell coupling and lateral migration effects of the aggressor memory cells. Accordingly, perfect compensation narrows the spread of the $V_t$ sub-distributions and thereby narrows the overarching $V_t$ distribution for a given programming level to enlarge one or more read windows and result in an increased RWB for a set of memory cells. As used herein, for a set of cells including a victim cell and one or more adjacent aggressor cells, "perfect compensation" refers to precise compensation for each of the possible specific cell-to-cell coupling and lateral migration effects on the victim cell. In other words, "perfect compensation" refers to an adjustment of an operation parameter that compensates for all of the possible victim cell $V_t$ shifts that can be caused by any of the corresponding programming states/levels to which the adjacent aggressor cells can be programmed.

However, the number and the parameters of the adjustments to the voltages applied during a memory cell access operation to compensate for the aforementioned effects can vary depending on multiple factors. For example, (i) the geometry of the array of memory cells; (ii) the sensitivity of a victim memory cells to an aggressor cell state; (iii) the programming level of a victim cell, (iv) the programming level of an aggressor cell, (v) the desired (i.e., target) RWB, the (vi) amount (e.g., in bits) of information about the aggressor cell programming levels that is to be used; (vii) the amount of energy used; and (vii) the amount of time used can each determine how a memory cell access operation is modified to compensate for the cell-to-cell coupling and lateral migration effects. Accordingly, the modification of the default parameters (e.g., adjustment of applied voltage levels) of the memory cell access operation can be tailored to achieve a desired RWB increase based on constraints relating to one or more of the aforementioned factors. The modifications of these parameters can depend on determining the programming levels of the specified cell and the neighboring cell in order to select an appropriate adjustment that accurately compensates for the effects on the specified cell.

Therefore, modifying the memory access operation can entail having to perform multiple operations on the specified cell and adjacent cells to determine the parameter adjustments that would accurately compensate for the cell-to-cell coupling and lateral migration effects. Due to this, the level of precision that is needed to determine the aggressor cell programming levels is directly correlated with the time it takes to make that determination. Accordingly, achieving a large RWB increase can require a proportionally longer amount of time. Similarly, the number of possible programming states that a cell can be programmed to is directly correlated with the number of bits of information needed to accurately reflect those states for making a corresponding modification based on that information. Therefore, achieving a large RWB increase can require accurate representation of the memory cell state information that uses a large number of bits to reflect the precisely determined programming states.

In some cases, all the possible shifts caused by the various possible states (i.e., programming levels) of one or more aggressor memory cell may need to be accounted for to achieve perfect compensation for a specified cell and thereby achieve a maximum possible increase in the RWB. However, this can often be an extremely resource intensive approach due to the additional operations needed to determine the modified parameters (e.g., adjusted voltages) for use with the memory access operation. Consequently, perfect compensation of these effects leads to increased time (e.g., tRead or tProg) needed to complete respective modified read or write operations and can significantly delay the transmission of data to or from the host device. However, in many cases it might not be necessary to obtain a maximum possible increase in RWB to achieve a desired performance improvement (e.g., decreased BER). For example, it may be the case that a lower increase in RWB is sufficient to achieve a target improvement in BER without needing to incur additional resource and time costs associated with perfect compensation. Accordingly, in such situations perfect compensation wastes time and resources and detrimentally increases data transfer latency between the memory device and host device.

Aspects of the present disclosure address the above and other deficiencies by balancing the resource and time demands of modifying memory access operations to compensate for cell-to-cell (C2C) coupling and lateral migration (LM) effects with achieving a desired RWB increase. The various embodiments described herein facilitate obtaining sufficient RWB gains without expending more computing resources than necessary to compensate for the aforementioned detrimental C2C coupling and LM effects. In general, in the embodiments, this is accomplished by determining how many bits of information describing aggressor memory cell states (i.e., information about the programming levels of one or more aggressor memory cells adjacent to a specified memory cell in question) should be used for making the requisite adjustments to parameters of a memory access operation to achieve a target RWB increase. As noted above, the particular adjustments and resulting gain in the RWB can depend on a variety of interrelated factors representative of the physical properties of the constituent elements of a memory device and of its desired performance characteristics.

Taking these factors into consideration, the embodiments of the present disclosure target a RWB gain that is sufficient to overcome the C2C coupling and LM effects causing errors on the memory device without resorting to perfect compensation that achieves the maximum possible RWB gain. To do this, some embodiments determine the minimum level of aggressor cell state information accuracy is needed to achieve the target RWB increase. Note that more bits are required for a more precise representation of an aggressor cell programming level/state. Furthermore, these bits of information can be used to make corresponding adjustments to memory access operation parameters to increase the RWB. Accordingly, the minimum level of accuracy needed to reach a desired RWB increase is directly related to the minimum number of bits aggressor cell state information needed to adjust the parameters of the memory cell access operation. Thus, the embodiments described herein determine the minimum number of bits of aggressor cell state information that should be used to achieve the target RWB increase Advantages of the embodiments of the present disclosure include, but are not limited to, mitigating the effects of C2C coupling and LM by utilizing less than perfect compensation. For example, a less resource intensive approach is implemented to reduce the time needed to complete the respective modified read or write operations. In the embodiments, the lower increase in RWB allows the use of fewer bits to reflect the aggressor cell state information since less precision is necessary to result in the desired RWB gain. Thus, although in some of the embodiments the RWB increase can be lower than the maximum possible RWB increase achieved from perfect compensation, it is sufficient to achieve a desired improvement in performance (e.g., reduced BER). The several embodiments conserve computing time and resources that would otherwise be wasted for achieving perfect compensation. Accordingly, the embodiments disclosed herein improve the efficiency of remedial modifications to memory access operations that compensate for C2C coupling and LM effects by reducing the time and energy used to reach the desired RWB increase. These and other elements and features of the embodiments are described initially with reference to FIG. 1 and FIGS. 2A-2D below.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device The memory sub-system 110 includes a compensation management component (CMC) 113 that can optimize C2C coupling and LM compensation to achieve a target increase in a RWB for a set of cells in the memory device 130. In some embodiments, the memory sub-system controller 115 includes at least a portion of the CMC 113. In some embodiments, the CMC 113 is part of the host system 110, an application, or an operating system. In other embodiments, local media controller 135 includes at least a portion of CMC 113 and is configured to perform the functionality described herein The CMC 113 can modify operations performed on the memory cells of memory device 130 to compensate for the effects of C2C coupling and LM based on a variety of factors to achieve a desired RWB increase. Further details with regards to the operations of the CMC 113 are described below with additional reference to FIGS. 2A-2D which depict an example memory cell arrangement, the effects of C2C coupling and LM, as well as example results of compensation.

Figure 2A:
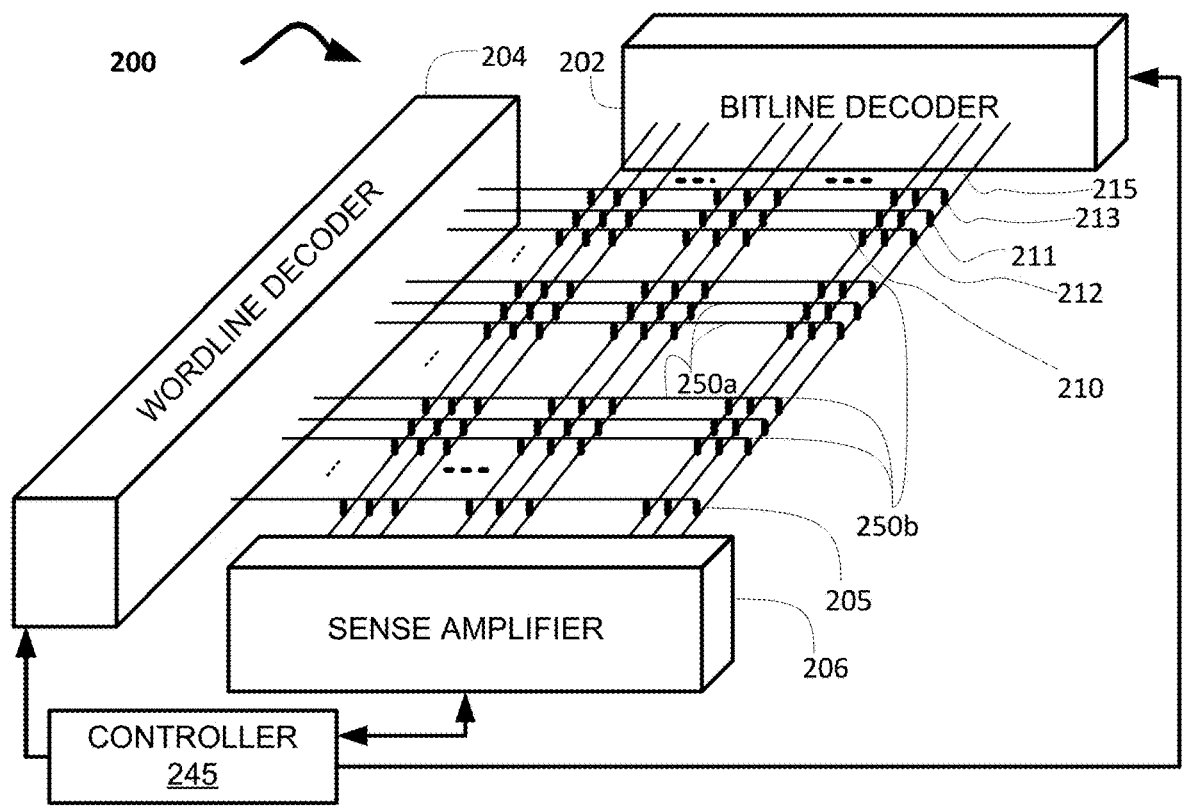
FIG. 2A illustrates an example array of memory cells in accordance with some embodiments of the present disclosure.
Figure 2B:
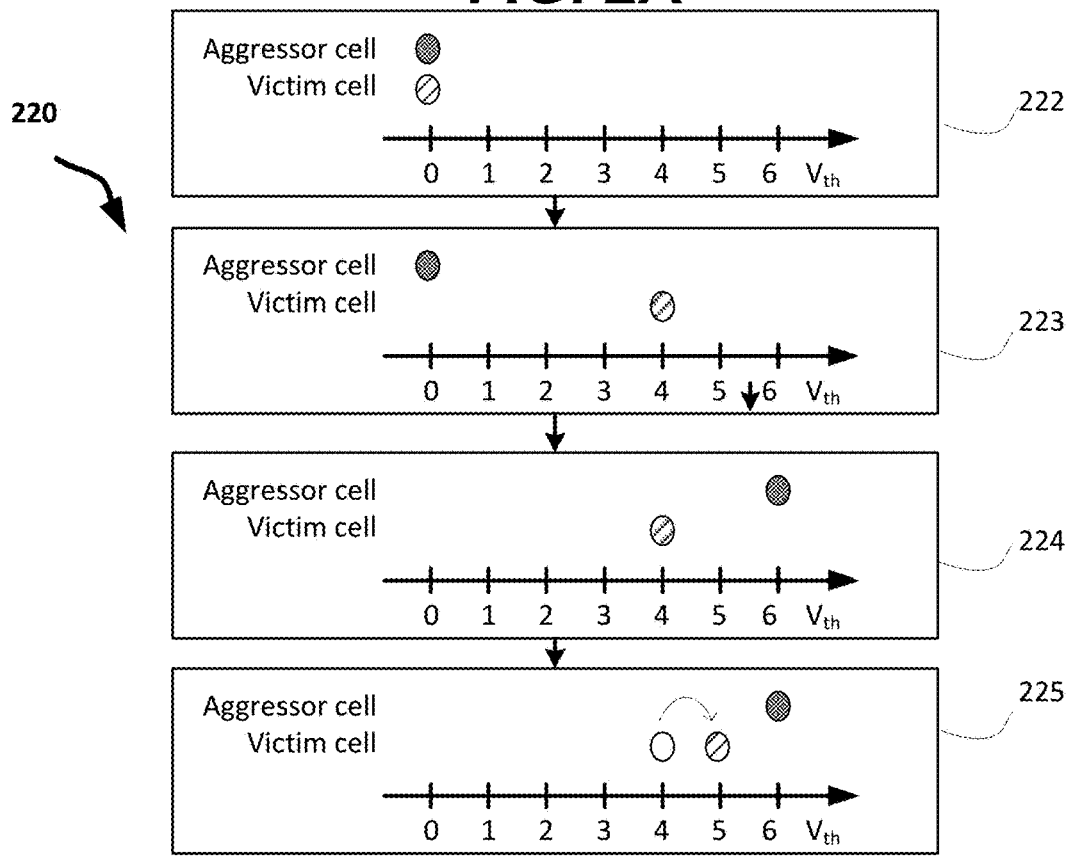
FIG. 2B is a flow chart showing the effects of an aggressor memory cell programming level on the threshold voltage of a victim memory cell in accordance with some embodiments of the present disclosure.
Figure 2C:
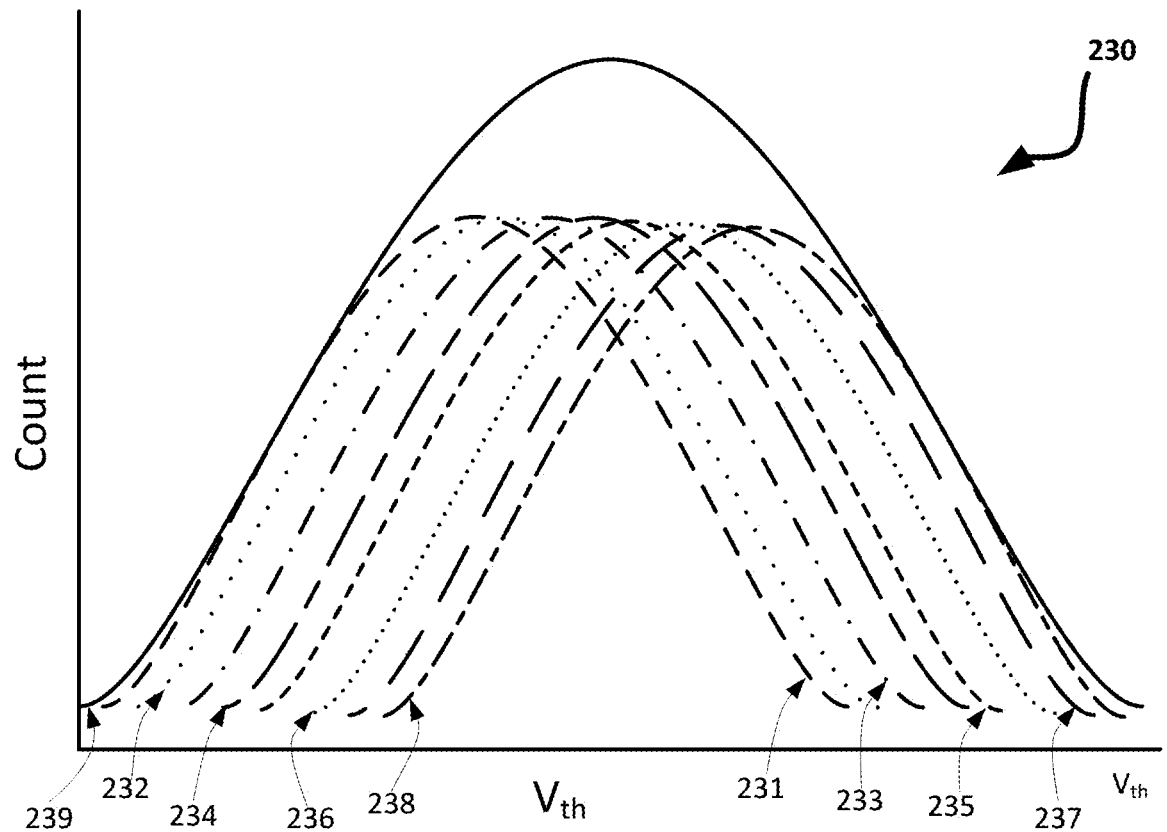
FIG. 2C illustrates an example threshold voltage distribution and its sub distributions in accordance with some embodiments of the present disclosure.

To further describe the features of CMC 113, consider an array 200 of multiple TLC memory cells 205, 211, 212, 213 illustrated in FIG. 2A in accordance with some embodiments of the present disclosure. Memory array 200 can include multiple wordlines 210 (e.g., row lines) and multiple bitlines 215 (e.g., column lines, pillars), labeled. In some embodiments, each row of memory cells 205, 211, 212, 213 is connected to a wordline 210, and each column of memory cells 205, 211, 212, 213 is connected to a bitline 215. Activating or selecting a wordline 210 or a bitline 215 can include applying a voltage to the respective lines.

Wordlines 210 and bitlines 215 can be substantially perpendicular (i.e., orthogonal) to one another or otherwise intersect one another to create an array of memory cells. As shown in FIG. 2A, one memory cell 212 can be located at the intersection of two conductive lines such as a wordline 210 and a bitline 215. This intersection can be referred to as an address of a memory cell 212. A specified memory cell 212 can be a memory cell 212 located at the intersection of an energized wordline 210 and bitline 215; that is, wordline 210 and bitline 215 can be energized to read, write, or otherwise access a memory cell 212 at their intersection. Other memory cells 205, 211, 213 that are in electronic communication with (e.g., connected to) the same wordline 210 or bitline 215 can be referred to as unspecified memory cells 205, 211, 213.

Electrodes can be coupled to a memory cell 205, 211, 212, 213 and a wordline 210 or a bitline 215. The term electrode can refer to an electrical conductor, and in some embodiments, can be employed as an electrical contact to a memory cell 205, 211, 212, 213. An electrode can include a trace, wire, conductive line, conductive layer, or the like that provides a conductive path between elements or components of memory device 130. In some examples, a memory cell 205, 211, 212, 213 can include multiple self-selecting or other memory components (e.g., a selection component and a storage component) separated from each other and from access lines 210, 215 by electrodes. For self-selecting memory cells 205, 211, 212, 213, a single component (e.g., a section or layer of chalcogenide material within the memory cell 205, 211, 212, 213) can be used as both a storage element (e.g., to store or contribute to the storage of a state of memory cell 205) and as a selector element (e.g., to select or contribute to the selection of the memory cell 205, 211, 212, 213).

In some embodiments, operations such as reading and writing can be performed on memory cells 205, 211, 212, 213 by activating or selecting a corresponding wordline 210 and bitline 215. Accessing memory cells 205, 211, 212, 213 can be controlled through a wordline decoder 204 and a bitline decoder 202. For example, a wordline decoder 204 can receive a row address from the memory controller 245 (which can be a version of memory sub-system controller 110 or CMC 113 of FIG. 1) and activate the appropriate wordline 210 based on the received row address. Such a process can be referred to as decoding a row or wordline address. Similarly, a bitline decoder 202 can receive a column address from the memory controller 245 and activate the appropriate bitline 215. Such a process can be referred to as decoding a column or bitline address. A wordline decoder 204 and/or bitline decoder 202 can be examples of decoders implemented using decoder circuitry, for example. In some embodiments, wordline decoder 204 and/or bitline decoder 202 can include circuitry that is configured to increase a voltage applied to a wordline 210 or bitline 215 (respectively).

In some embodiments, a memory cell 205, 211, 212, 213 can be read (e.g., sensed) by a sense amplifier 206 when the memory cell 205, 211, 212, 213 is accessed (e.g., in cooperation with the memory controller 245, wordline decoder 204, and/or bitline decoder 202) to determine a logic state stored by the memory cell 205, 211, 212, 213. The sense amplifier 206 can provide an output signal indicative of (e.g., based at least in part on) the logic state stored by the memory cell 205, 211, 212, 213 to one or more components (e.g., to the bitline decoder 202, the memory controller 245). In some embodiments, the detected logic state can be provided to a host system 120 (e.g., a device that uses the memory device 130 for data storage), where such signaling can be provided directly from the memory controller 245, memory sub-system controller 115, or CMC 113.

In some embodiments, sense amplifier 206 can include various transistors or amplifiers to detect and amplify a difference in signals obtained based on reading a memory cell 205, 211, 212, 213, which can be referred to as latching. The detected logic state of memory cell 205, 211, 212, 213 can then be output through bitline decoder 202 as output. In some embodiments, sense amplifier 206 can be part of a bitline decoder 202 or row decoder 120. Alternatively, sense amplifier 206 can be connected to or in electronic communication with bitline decoder 202 or wordline decoder 204.

In some embodiments, read/write/erase operations can be performed on memory cells 205, 211, 212, 213. The performance of such operations can be controlled by memory controller 245 (which can be a version of memory sub-system controller 110 or CMC 113 of FIG. 1). Accordingly, operations, such as write operations to be performed on memory array 200 can be distributed among the memory cells 205, 211, 212, 213. In one embodiment, the wordlines 210 can be grouped according to a value of a metric reflecting a property or characteristic of the memory cells of the group (e.g., a default voltage that needs to be applied to program the cells of the wordline to a particular programming level). For example, in the embodiment depicted in FIG. 2A, some of the wordlines 210 of array 200 can be grouped into a first group 250a that by default initially needs voltage X to program its cells to programing level 2, and a second group 250b that by default initially needs voltage Y to program its cells to programing level 2. Each of the groups can have a value of a metric that that reflects a property or characteristic of the memory cells in the group falling within a range of possible values.

These default values and other characteristics of the memory cells 205, 211, 212, 213 can be altered by the effects of C2C coupling and LM described above. Take for example, memory cell 211 that is specified to be accessed by a memory access operation (e.g. read/write) by specifying and activating the respective bitline and wordline at the intersection of which it is located. The specified wordline can be referred to as an n-th wordline ($WL_n$), and the adjacent wordlines can include adjacent wordline n-1 ($WL_{n-1}$) and adjacent wordline n+1 ($WL_{n+1}$). Thus, the specified cell 211 can have a respective group of adjacent cells. Each group of adjacent cells can include at least one cell that neighbors its respective specified cell (e.g., one cell 212 connected to $WL_{n-1}$ and/or one cell 213 connected to $WL_{n+1}$).

The memory cells 205, 211, 212, 213 can be categorized into aggressor cells and victim cells. More specifically, an aggressor memory cell can be defined by an effect its programming level has on a threshold voltage of an adjacent memory cell. The adjacent cell can thus be defined as the victim cell as it is affected by the programming level of the aggressor cell. This categorization and relationship is depicted in the flow chart of FIG. 2B.

Take for example memory cell 211 which can be subject to the effects of phenomena such as LM and C2C coupling. If memory cell 211 is subject to an effect of a programming level of its adjacent cell 212, then memory cell can be considered to be the victim cell 211 and the adjacent cell 212 can be considered to be the aggressor cell 212. Initially, at block 222, both cells have a $V_t$ of 0. When the victim cell 211 is programmed, at block 223, to have a $V_t$ of 4v, it might not yet be affected by the programming level of the aggressor memory cell 212 since the aggressor memory cell 212 still has a $V_t$ of 0v. Thereafter, the C2C coupling effect can become observable as the aggressor memory cell 212 is programmed at block 224 to have a $V_t$ of 6v. As can be seen in block 225, the $V_t$ of the victim cell 211 can increase from 4v to 5v caused by the programming level corresponding to the aggressor memory cell's $V_t$ of 6v due to C2C coupling. In a similar manner, the $V_t$ of victim memory cell 211 can be affected by the programming level (i.e., by the corresponding $V_t$) of adjacent aggressor cell 213.

Thus, in the various embodiment the CMC 113 compensates for the resulting distributions of $V_t$ of victim cells caused by aggressor cell programming levels. Take for example, a plot 230 of victim cell $V_t$ depicted in FIG. 2C in accordance with an embodiment of the disclosure. The example plot 230 of $V_t$ distributions is associated with of an example group of TLC memory cells (e.g., cells 205, 211, 212, 213) programmed to programming level 3. As can be seen, the overarching distribution 239 of $V_t$ for the cells programmed to programming level 3 includes multiple sub-distributions 231-238. Each of these sub-distributions 231-238 reflect the $V_t$ of victim cells programmed to level 3 that happen to have an adjacent aggressor memory cell programmed to a particular programming level that shifts the respective $V_t$ of the victim cell. For example, sub-distribution 231 is a distribution of $V_t$ that is not shifted because the adjacent aggressor cells of the victim cells in the distribution are programmed to programming level 0. In contrast, sub-distribution 232 is shifted due to aggressor memory cells programmed to programming level 1. Sub-distribution 233 is shifted due to aggressor memory cells programmed to programming level 2. Sub-distribution 234 is shifted due to aggressor memory cells programmed to programming level 3. Sub-distribution 235 is shifted due to aggressor memory cells programmed to programming level 4. Sub-distribution 236 is shifted due to aggressor memory cells programmed to programming level 5. Sub-distribution 237 is shifted due to aggressor memory cells programmed to programming level 6. Sub-distribution 238 is shifted due to aggressor memory cells programmed to programming level 7.

Accordingly, it can be seen how the $V_t$ distribution for a set of victim memory cells has sub-distributions of $V_t$ dependent on the programming level of aggressor memory cells. For example, the sub-distribution 238 is shifted to the right relative to the default sub-distribution 231 by a greater amount than sub-distribution 234. This is because the victim cells of sub-distribution 238 are adjacent to aggressor cells of a higher programming level (i.e., 7) than those of sub-distribution 234. Notably, variations of the depicted shifts that are shown for one victim cell programming level can also exist for other programming levels of the victim cell. The other programming levels of the victim cells can likewise be affected by the programming levels of adjacent aggressor cells and have corresponding shifts in their respective sub-distributions.

Figure 2D:
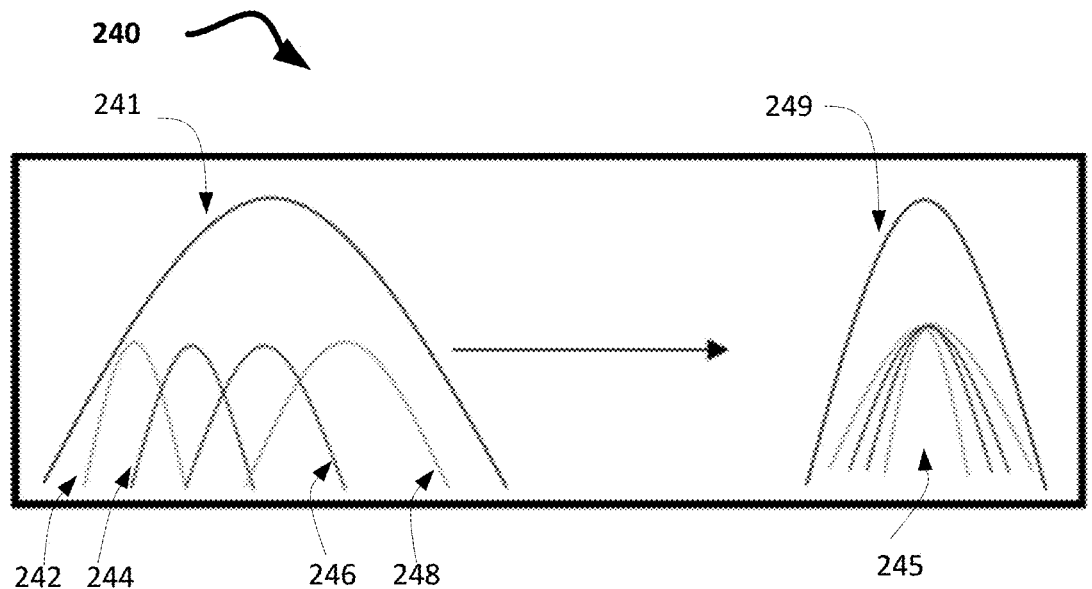
FIG. 2D depicts a plot of threshold voltage distribution and its sub distributions being aligned to narrow the distribution's spread in accordance with some embodiments of the present disclosure.

Thus, in some embodiments, CMC 113 can compensate for these $V_t$ shifts by taking these shifts into consideration when performing read or write operations on the specified memory cells. An example plot resulting from such compensation is depicted in FIG. 2D in accordance with an embodiment of the disclosure. For example, overarching $V_t$ distribution (i.e., for a set of victim memory cells at programming level N) can include sub distributions 242, 244, 246, 248. Each of the sub-distributions can be shifted by a different amount based on a corresponding aggressor cell programming level. In some embodiments, CMC 113 can compensate for every one of these $V_t$ shifts that can be caused by every possible corresponding aggressor memory cell programming level and thereby achieve perfect compensation. Perfect compensation can include CMC 113 adjusting the parameters of these operations (e.g., by adjusting one or more voltages that are applied) to align the means of the sub-distributions to a single value 245 and thereby narrow the overarching original distribution 241 to the resulting distribution 249. Narrowing the spread of the overarching distribution caused an increase in the RWB.

In some embodiments, to compensate for the shifts, CMC 113 can perform corrective read operations (e.g., adjust read reference voltages applied during the read operations that are offset by an amount corresponding to the shift). This can entail ensuring that a read reference voltage falls within a valley between distributions and does not inadvertently fall within one of the shifted sub-distributions. Similarly, in other embodiments, CMC 113 can adjust PV voltages applied during write operations by an amount corresponding to the shift. This can entail the adjustment of PV voltages to correspond to the resulting voltage distribution of the specified cells when the aggressor cells' effects (e.g., C2C coupling) are taken into consideration. Accordingly, perfect compensation involves compensating for every one of the possible shifts and corresponding shift scenarios. Consequently, it will also result in the maximum possible RWB increase.

Because each shift depends on a particular programming level of an aggressor memory cell, a larger number of possible aggressor memory cell programming levels will entail a larger number of possible shifts to be accounted for. As noted earlier, the aggressor memory cell programming levels can be encoded in or reflected by a sufficient number of bits. For example, 1 bit of information is sufficient to reflect all the possible programming level for an SLC aggressor memory cell. In contrast, to reflect all the possible programming level for a TLC aggressor memory cell, 3 bits of information can be needed. Thus, the CMC 113 can use a corresponding number of bits of aggressor memory cell state information for compensation.

Furthermore, in some embodiments, the CMC 113 need not perfectly compensate for every possible shift, but can instead partially compensate for them by using fewer bits of aggressor memory cell state information. The CMC can group the aggressor memory cell programming levels into groups such that the number of groups reflects that number of bits of aggressor memory cell information needed to determine the group into which an aggressor memory cell falls. For example, the 8 possible programming levels of a TLC memory cell can be grouped into two groups by placing programming levels 1-4 (i.e., representing a relatively low programing level) into group 1 and programming levels 5-8 (i.e., representing a relatively high programing level) into group 2. In this manner, the programming level of a TLC cell can be reflected using 1 bit of information instead of 3 bits. Based on the grouping, CMC 113 can partially compensate for the aforementioned shift by adjust the memory access operations in accordance with the number of bits of aggressor memory cell information that are being used. For example, instead of compensating for each possible shift, the shifts caused by programming levels in group 1 can be partially compensated with one voltage offset while the shifts caused by programming levels in group 2 can be partially compensated by another voltage offset.

Consequently, in some embodiments, the CMC 113 can use more bits of aggressor memory cell state information to achieve a greater RWB increase and use fewer bits of aggressor memory cell state information to achieve a lesser RWB increase. To do this, the CMC 113 can group the aggressor memory cell programming levels into a corresponding number of groups depending on the number of bits of aggressor memory cell stat information that are to be used for compensation.

Notably, the RWB increase achieved with compensation is directly correlated with the time and computing resources required to achieve it. In other words, the higher the number of bits of aggressor memory cell state information used by the CMC 113 for compensation, the higher the resulting RWB gain and the longer it takes. Accordingly, using a higher number of bits of aggressor memory cell state information entails a correspondingly larger cost of the compensation. For example, a 1-bit corrective read operation entails 1 read at the aggressor cell to determine its state and 2 possible reads at the victim cell (i.e., including each adjusted read reference voltage to account for each possible aggressor memory cell programming state) for a total of 3 reads. Similarly, a 2-bit corrective read operation entails 3 read at the aggressor cell to determine its state and 4 possible reads at the victim cell (i.e., including each adjusted read reference voltage to account for each possible aggressor memory cell programming state) for a total of 7 reads. Analogously, a 3-bit corrective read operation entails 7 read at the aggressor cell to determine its state and 8 possible reads at the victim cell (i.e., including each adjusted read reference voltage to account for each possible aggressor memory cell programming state) for a total of 15 reads. This relationship can be generalized by stating that an n-bit corrective read operation entails $2^n-1$ reads at the aggressor memory cell (to account for all the aggressors except the first one which doesn't affect victim cell), and up to $2^n$ adjusted reads at the victim, for a possible total of $2^{n+1}-1$ reads. In some embodiments, an analogous relationship exists for the compensatory adjustment of PV voltages applied in the course of write operations.

Accordingly, in some embodiments, the CMC 113 can determine how many bits of aggressor memory cell state information are to be used by balancing the resources used for compensation with the resulting RWB gain. The CMC 113 can initially select a target RWB gain for C2C coupling and/or LM compensation based on the reliability requirements of the memory device (i.e., based on a desired performance level or BER). This targeted increase or gain value can be programmed to be static or changeable for a memory device 130. Thus, CMC 113 can select a target RWB increase for one or more specified memory cells.

Note that, in the various embodiments, the C2C coupling and LM effects on a specified cell (i.e., victim cell on wordline $WL_n$) can come from any adjacent cell (i.e., an aggressor cell on wordline $WL_{n-1}$ or $WL_{n+1}$) or a group of adjacent aggressor memory cells. Therefore, CMC 113 can identify a set of aggressor memory cells that are adjacent to the specified memory cell to compensate for their effects on the specified cells. Since the aggressor memory cells in the set can each have different programming level states the aggressor memory cells in the set can require different numbers of bits to represent their respective states. Accordingly, in some embodiments, the CMC 113 can generate a list of programming level states for the set of aggressor memory cells. Because the C2C coupling and LM effects can be attributable to aggressor memory cells adjacent to the specified cell(s) in any direction, it is beneficial to identify the adjacency direction of the aggressor memory cell along with an indication of its programming level in an entry in the list. Based on the programming levels of the aggressor memory cells, the CMC 113 can generate a corresponding list of entries indicating the number of bits needed to represent those programming level states at each respective adjacency direction relative to the specified cell(s).

For example, in some embodiments, the entries in the list can be recorded as sets of comma separated values of the following form: [# of bits of representative of aggressor memory cell state for adjacent cell at $WL_{n-1}$, # of bits of representative of aggressor memory cell state for adjacent cell at $WL_{n+1}$]. Accordingly, the CMC 113 can generate a list of entries [x bits from $WL_{n-1}$, y bits from $WL_{n+1}$]=[x,y] such as the following: [1 bit from $WL_{n-1}$, 0 bits from $WL_{n+1}$]=[1, 0] having a total of 1 bits of aggressor memory cell state information; [0 bits from $WL_{n-1}$, 1 bit from $WL_{n+1}$]=[0, 1] having a total of 1 bits of aggressor memory cell state information; [1 bit from $WL_{n-1}$, 1 bit from $WL_{n+1}$]=[1, 1] having a total of 2 bits of aggressor memory cell state information; [2 bits from $WL_{n-1}$, 0 bits from $WL_{n+1}$]=[2, 0] having a total of 2 bits of aggressor memory cell state information; etc.

Accordingly, each entry in the list can include a particular number of bits used to indicate the programming level of a corresponding aggressor memory cell in the set. Thus, each entry in the list can specify, for each aggressor memory cell, a respective number of bits that are used to reflect the cell's programming level. Furthermore, the total number of bits specified in each entry can be associated with a corresponding maximum RWB increase that would result from the CMC 113 making a corresponding adjustment to a parameter of a memory access operation that is performed with respect to the specified memory cell. In some embodiments, the adjustment to the parameter (e.g., applied voltage level) of the memory access operation can compensate for an aggressor memory cell programming level specified by the bits (e.g., 3 bits) in the identified entry. Consequently, in those embodiments, each corresponding adjustment made by the CMC 113 to the parameter of the memory access operation can include an adjustment of one or more voltages (e.g., read reference voltage, PV voltage) applied to the specified memory cell(s). In some embodiments, each of these voltages to which adjustments are made corresponds to a different target programming level of the specified memory cell(s) for which the RWB increase is to be obtained.

For example, the maximum RWB increase could be determined by the CMC 113 using 2 bits of aggressor memory cell state information to adjust the voltages with corresponding offsets during a read/write operation that compensate for the C2C coupling and/or LM effects. Thus, in some embodiments, the adjustment made to the parameter by the CMC component 113 is based on the maximum number of aggressor memory cell programming levels that can be represented by the bits in the entry (i.e., the maximum number of aggressor cell state that can be encoded using that number of bits). Since the maximum number of aggressor memory cell programming levels is directly related to the maximum RWB increase that can be obtained if all of those possible programming levels are accounted for using the corresponding number of bits of aggressor memory cell information, each entry is associated with a corresponding maximum RWB increase.

Further, the CMC 113 can identify out of all the entries in the list that associated with a maximum RWB increase that is greater than or equal to the target RWB increase, the entry having the fewest (i.e., a lowest number of) bits. To achieve this, the CMC can search among all entries in the list having a total number of bits associated with the maximum RWB increase that is greater than or equal to the target RWB increase, a target entry having the lowest total number of bits by. In some embodiments, the CMC 113 can search for the target entry having the fewest total bits by starting with an entry having the most bits and then iteratively selecting, from the list, the subsequent entry having fewer bits than the previous entry. For each iteratively selected entry from the list, the CMC 113 can compare the maximum RWB increase with the target RWB increase until the target entry is selected (i.e., the target entry being the entry having the smallest number of bits and also being associated with a maximum RWB increase that is greater than or equal to the target RWB increase). If no entries in the list are associated with a maximum RWB increase that is greater than or equal to the target RWB increase (i.e., if CMC 113 cannot achieve the target RWB increase using the number of bits included in any of the listed entries), then CMC 113 can redefine (e.g., reduce) the target RWB increase and iterate through the list again in a manner analogous to the one described above.

In contrast, if such an entry exists, the CMC 113 can proceed to perform compensation based on that entry that includes the lowest number of bits. Therefore, in response to identifying the entry with a total number of bits associated with a maximum RWB increase that is greater than or equal to the target RWB increase, the CMC 113 can modify the parameter of the memory access operation with the adjustment associated with the identified entry. For example, if the entry has N bits of aggressor memory state information the CMC 113 can modify the voltages applied during a read/write operation using N bits of information to compensate for the C2C coupling and/or LM effects of the aggressor cell(s) on the specified cell(s). In one embodiment, to modify the parameter of the memory access operation, the CMC 113 can adjust a program verify (PV) voltage level with respect to the specified memory cell. In another embodiment, to modify the parameter of the memory access operation, the CMC 113 can adjust a read voltage level (i.e., read reference voltage) with respect to the specified memory cell. Thus, by picking the entry in the list having the lowest number of bits, the CMC 113 can make corresponding voltage adjustments that achieve the target RWB gain without having to compensate perfectly for every possible aggressor memory cell state. The benefits and advantages of the various embodiments disclosed herein are described in more detail with reference to methods depicted in FIGS. 3-5.

FIG. 3 is a flow diagram of an example method 300 for managing C2C and LM compensation in memory devices in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 300 can be applied to a memory device having multiple victim cells and aggressor memory cells in one or more arrays. The aggressor memory cells can be defined as aggressors relative to specified memory cells that can be defined as victims based on the effect that the programming level of the aggressor cells has on a threshold voltage adjacent victim memory cells. Therefore, to mitigate the effect, at block 302, the processing logic can select a target RWB increase for one or more specified memory cells. Since more than one aggressor cell can contribute to the effect on the victim cell, the processing logic can, at block 304, identifying a set of aggressor memory cells that are adjacent to the specified memory cells.

Further, at block 306, the processing logic can generate a list of programming level states for the set of aggressor memory cells. Each entry in the list generated at block 306 can include and specify a particular number of bits used to reflect the programming level of one or more corresponding aggressor memory cells in the set. Accordingly, in some embodiments, the total number of bits in each entry can be associated with a corresponding maximum RWB increase resulting from the use of that number of bits for compensation of the C2C coupling and/or LM effects. As discussed earlier, the compensation can include a corresponding adjustment made by the processing logic to a parameter of a memory access operation with respect to the specified memory cell. In some embodiments, the adjustment made by the processing logic can be based on the maximum number of programming levels reflected by the bits in the entry (e.g., to compensate for the maximum number of possible effects on the specified cells).

In addition, at block 308, the processing logic can identify in the list an entry that satisfies both of the following two criteria: (i) being associated with a maximum RWB increase that is greater than or equal to the target RWB increase, and (ii) having a lowest number of bits out of all the entries in the list that satisfy criterion (i). If the processing logic does not identify such an entry, the processing logic can redefine the target RWB increase and repeat the operations of blocks 302-308. Having identified the entry at block 308 (i.e., the entry with the lowest total number of bits and also associated with a maximum RWB increase that is greater than or equal to the target RWB increase), the processing logic can in response, at block 310 modifying the parameter of the memory access operation with the adjustment associated with the identified entry. For example, the processing logic can adjust a read voltage level (i.e. offset a read reference voltage applied during a read operation) or adjust a PV voltage (i.e., offset a PV voltage level applied during a write operations. The generation of the list and identification of the desired entry is described in more detail below with reference to FIG. 4.

Figure 4:
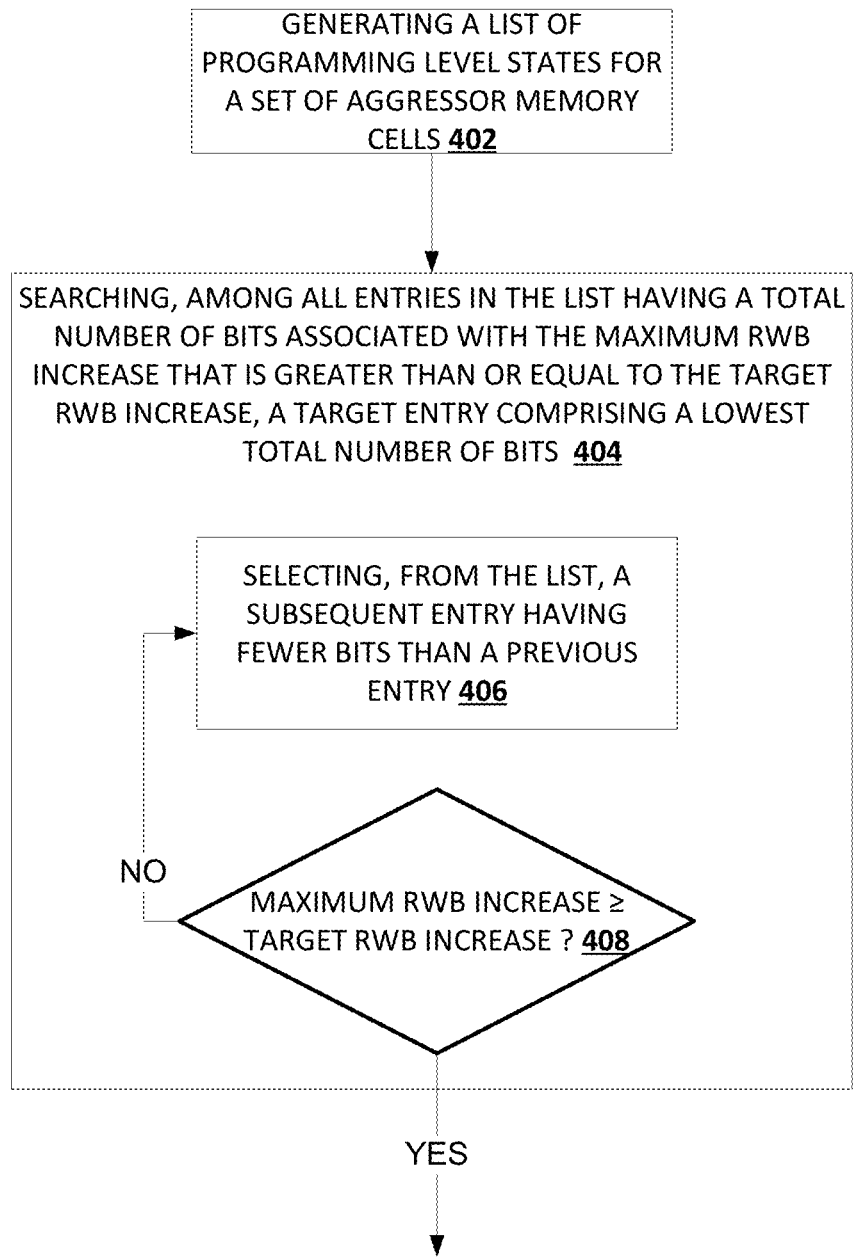
FIG. 4 is a flow diagram of an example method for compensation management in accordance with some embodiments of the present disclosure.

FIG. 4 is a flow diagram of an example method 400 for managing C2C and LM compensation in memory devices in accordance with some embodiments of the present disclosure and further describes operations similar to those of blocks 306-308 of FIG. 3. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Accordingly, in some embodiments, at block 402, the processing logic can generate a list of programming level states for the set of aggressor memory cells. That list can include multiple entries each of which can include different numbers of bits of aggressor memory state information. Each of the entries can therefore be associated with a RWB increase that results from using that number of bits for compensating C2C coupling and/or LM effects on one or more specified cells. Therefore, the processing logic can, at block 404, search among all entries in the list having a total number of bits associated with the maximum RWB increase that is greater than or equal to the target RWB increase for a target entry. The target entry could be the entry having the lowest total number of bits (i.e., out of the entries that have an associated maximum RWB increase that is greater than or equal to the target RWB increase). The processing logic can search for the target entry by, at block 406, starting with the entry that has the most bits and then iteratively selecting, from the list, the subsequent entry having fewer bits than the previous entry. Further, at block 408, the processing logic can also determine for each iterative selection whether it is the target entry by comparing the associated maximum RWB increase with the target RWB increase until the target entry is selected (i.e., the entry associated with the maximum RWB increase that is greater than or equal to the target RWB increase).

Figure 5:
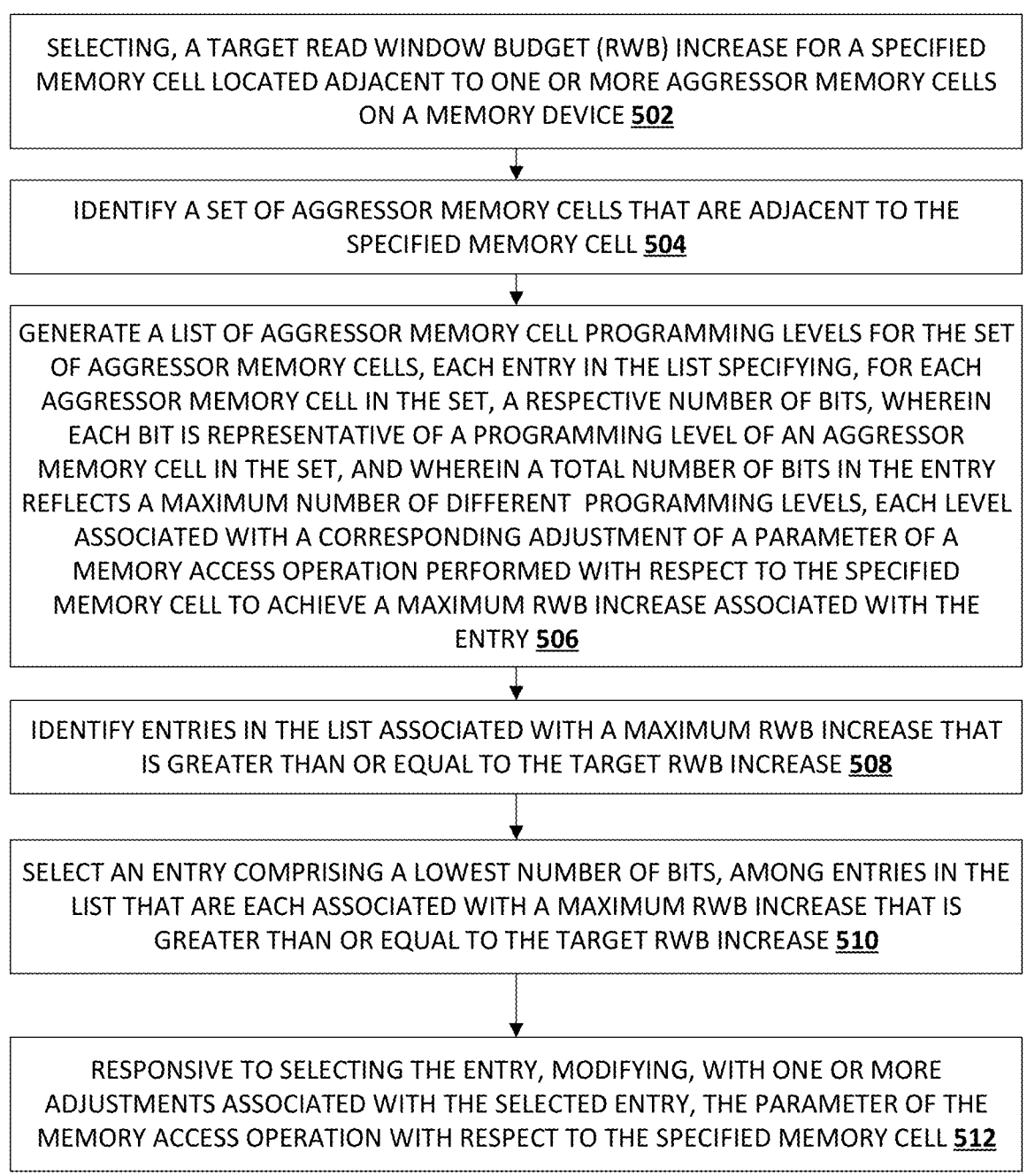
FIG. 5 is a flow diagram of an example method for compensation management in accordance with some embodiments of the present disclosure.

FIG. 5 is a flow diagram of an example method 500 for managing C2C and LM compensation in memory devices in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the CMC 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 502, the processing logic can select a target RWB increase for one or more specified memory cells located adjacent to one or more aggressor memory cells on a memory device. Each aggressor memory cell can be understood to be a cell whose its programming level has an effect on a threshold voltage of an adjacent memory cell (i.e., victim cell). In some embodiments, the processing logic can, at block 504, identify a set of such aggressor memory cells that are adjacent to the one or more specified memory cells.

Having identified the set, the processing logic can, at block 506, generate a list of aggressor memory cell programming levels for the set of aggressor memory cells. In some embodiments, each entry in the list can specify, for each aggressor memory cell in the set, a respective number of bits and thereby can include a particular number of bits of aggressor memory cell information. In other words, each bit of the total number of bits in the entry can be representative of a corresponding programming level of an aggressor memory cell in the set. Accordingly, in some embodiments, the number of bits in the entry can reflect a particular maximum number of different programming levels (i.e., the largest number of aggressor memory cell programming level states that can be represented using that number of bits). Each of these aggressor memory cell programing levels can, at block 506, be associated by the processing logic with a corresponding adjustment of a parameter of a memory access operation performed with respect to the specified memory cells to achieve a maximum RWB increase associated with the entry (i.e., the maximum RWB increase that can be obtained by the processing logic if that number of bits is used for compensating the C2C coupling and/or LM effects).

In some embodiments, each of these corresponding adjustment of the parameter of the memory access operation can compensate a perceived offset of a threshold voltage of a programming state of the specified memory cells caused by a particular adjacent aggressor memory cell programming level threshold voltage. In some examples, each corresponding adjustment of the parameter of the memory access operation can include an adjustment of one or more voltages applied to the specified memory cells. In some embodiments, the total number of the voltages can correspond to the maximum number of unique combinations of bit values representable using the number of bits in the entry.

In several embodiments, the processing logic can, at block 508, identify entries in the list that are associated with a maximum RWB increase that is greater than or equal to the target RWB increase. Further, at block 510, the processing logic can select the entry that has the lowest number of bits among the entries in the list that are each associated with a maximum RWB increase that is greater than or equal to the target RWB increase. In response to selecting the entry, the processing logic, at block 512, can modify with one or more adjustments associated with the selected entry, the parameter of the memory access operation with respect to the specified memory cell. For example, in some embodiments, the processing logic can, at block 512, modify the parameter of the memory access operation by adjusting a program verify (PV) voltage level with respect to the specified memory cell. In other embodiments, the processing logic can, at block 512, modify the parameter of the memory access operation by adjusting one or more read voltage thresholds (e.g., read reference voltage levels) with respect to the specified memory cell.

Figure 6:
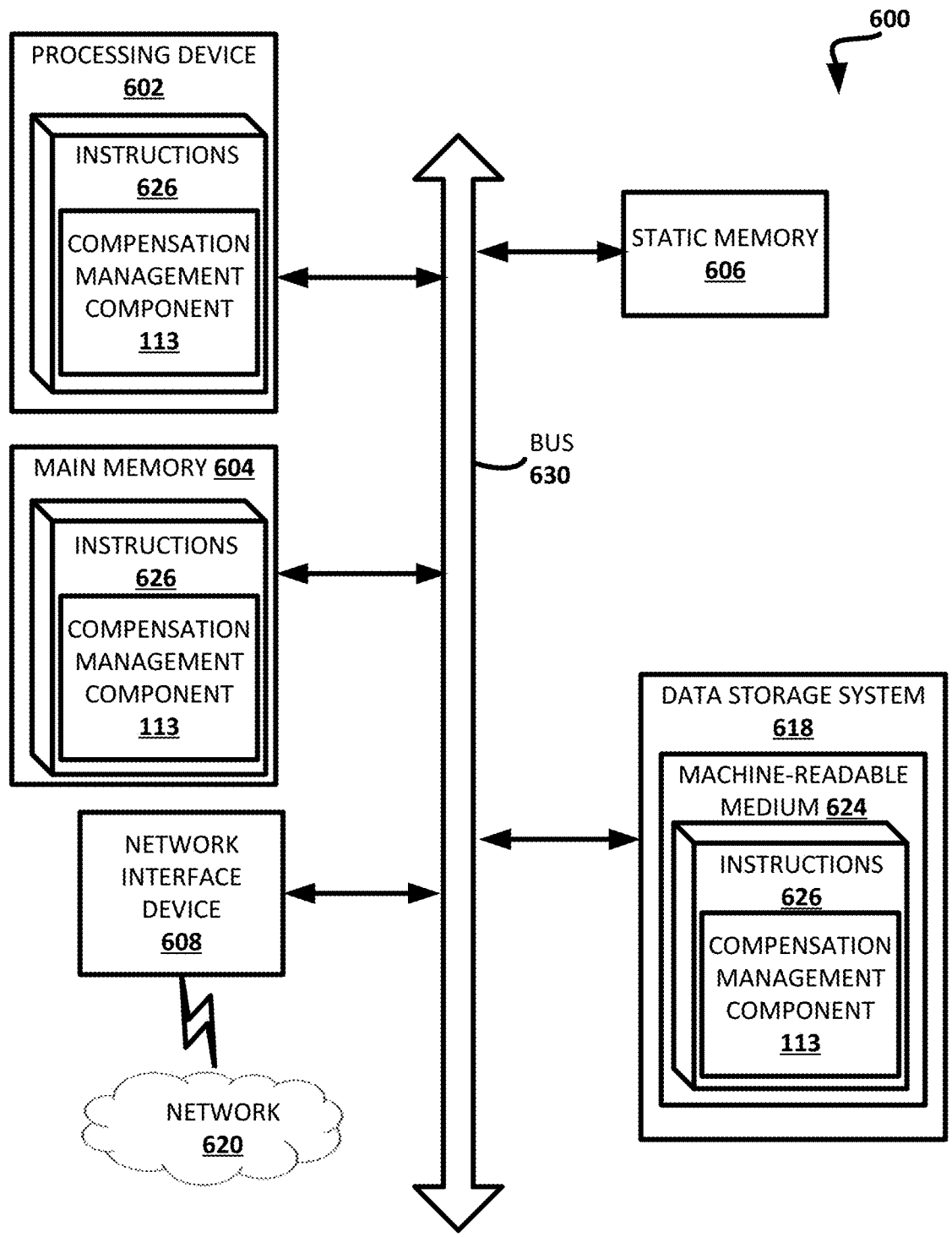
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the CMC 113 of FIG. 1, to method 300 of FIG. 3, to method, 400 of FIG. 4, or to method 500 of FIG. 5.). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a compensation management component (e.g., the CMC 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
identifying a set of aggressor memory cells of the memory device that are adjacent to a specified memory cell of the memory device;
generating a list of programming level states for the set of aggressor memory cells, wherein each entry in the list specifies, for each aggressor memory cell in the set, a respective number of bits used to reflect the programming level of the aggressor memory cell, and wherein a total number of bits specified by each entry is associated with a corresponding maximum read window budget (RWB) increase;

identifying, in the list, an entry associated with a maximum RWB increase that is greater than or equal to a target RWB increase, the entry comprising a lowest number of bits;

adjusting, based on the maximum RWB increase, a memory access parameter value; and performing, using the adjusted memory access parameter value, a memory access operation with respect to the specified memory cell.

2. The system of claim 1, wherein identifying, in the list, the entry associated with the maximum RWB increase that is greater than or equal to the target RWB increase further comprises:

searching, among all entries in the list having a total number of bits associated with the maximum RWB increase that is greater than or equal to the target RWB increase, a target entry comprising a lowest total number of bits by:

iteratively selecting, from the list, a subsequent entry having fewer bits than a previous entry; and comparing, for each iterative selection, the maximum RWB increase with the target RWB increase until the target entry associated with the maximum RWB increase that is greater than or equal to the target RWB increase is selected.

3. The system of claim 1, wherein an adjustment to the memory access parameter value compensates for an aggressor memory cell programming level represented by the bits in the identified entry.

4. The system of claim 1, wherein an adjustment to the memory access parameter value comprises an adjustment of one or more voltages applied to the specified memory cell.

5. The system of claim 4, wherein each voltage of the one or more voltages corresponds to a different target programming level of the specified memory cell.

6. The system of claim 1, wherein modifying the parameter of the memory access operation comprises adjusting a program verify (PV) voltage level with respect to the specified memory cell.

7. The system of claim 1, wherein modifying the parameter of the memory access operation comprises adjusting a read voltage level with respect to the specified memory cell.

8. A method comprising:

identifying, by a processing device, a set of aggressor memory cells of a memory device that are adjacent to a specified memory cell of the memory device;

generating a list of programming level states for the set of aggressor memory cells, wherein each entry in the list specifies, for each aggressor memory cell in the set, a respective number of bits used to reflect the programming level of the aggressor memory cell, and wherein a total number of bits specified by each entry is associated with a corresponding maximum RWB increase;

identifying, in the list, an entry associated with a maximum RWB increase that is greater than or equal to a target RWB increase, the entry comprising a lowest number of bits;

adjusting, based on the maximum RWB increase, a memory access parameter value; and performing, using the adjusted memory access parameter value, a memory access operation with respect to the specified memory cell.

9. The method of claim 8, wherein identifying, in the list, the entry associated with the maximum RWB increase that is greater than or equal to the target RWB increase comprises:

searching, among all entries in the list having a total number of bits associated with the maximum RWB increase that is greater than or equal to the target RWB increase, a target entry comprising a lowest total number of bits by:

iteratively selecting, from the list, a subsequent entry having fewer bits than a previous entry; and comparing, for each iterative selection, the maximum RWB increase with the target RWB increase until the target entry associated with the maximum RWB increase that is greater than or equal to the target RWB increase is selected.

10. The method of claim 8, wherein an adjustment to the memory access parameter value compensates for an aggressor memory cell programming level represented by the bits in the identified entry.

11. The method of claim 8, wherein an adjustment to the memory access parameter value comprises an adjustment of one or more voltages applied to the specified memory cell.

12. The method of claim 11, wherein each voltage of the one or more voltages corresponds to a different target programming level of the specified memory cell.

13. The method of claim 8, wherein modifying the parameter of the memory access operation comprises adjusting a program verify (PV) voltage level with respect to the specified memory cell.

14. The method of claim 8, wherein modifying the parameter of the memory access operation comprises adjusting a read voltage level with respect to the specified memory cell.

15. A non-transitory computer-readable storage medium comprising instructions that, when executed by a processing device, cause the processing device to perform operations comprising:

identifying a set of aggressor memory cells of a memory device that are adjacent to a specified memory cell of the memory device;

generating a list of programming level states for the set of aggressor memory cells, wherein each entry in the list specifies, for each aggressor memory cell in the set, a respective number of bits used to reflect the programming level of the aggressor memory cell, and wherein a total number of bits specified by each entry is associated with a corresponding maximum RWB increase;

identifying, in the list, an entry associated with a maximum RWB increase that is greater than or equal to a target RWB increase, the entry comprising a lowest number of bits;

adjusting, based on the maximum RWB increase, a memory access parameter value; and performing, using the adjusted memory access parameter value, a memory access operation with respect to the specified memory cell.

16. The non-transitory computer-readable storage medium of claim 15, wherein an adjustment to the memory access parameter value compensates a perceived offset of a threshold voltage of a programming state of the specified memory cell caused by an adjacent aggressor memory cell programming level threshold voltage.

17. The non-transitory computer-readable storage medium of claim 15, wherein an adjustment to the memory access parameter value comprises an adjustment of one or more voltages applied to the specified memory cell.

18. The non-transitory computer-readable storage medium of claim 17, wherein a total number of the one or more voltages corresponds to a maximum number of unique combinations of bit values of the bits in the entry.

19. The non-transitory computer-readable storage medium of claim 15, wherein modifying the parameter of the memory access operation comprises adjusting a program verify (PV) voltage level with respect to the specified memory cell.

20. The non-transitory computer-readable storage medium of claim 15, wherein modifying the memory access operation comprises adjusting one or more read voltage thresholds with respect to the specified memory cell.

* * * * *